(12) United States Patent
Kim

(10) Patent No.: US 11,591,227 B2
(45) Date of Patent: Feb. 28, 2023

(54) SIC MATERIAL AND SIC COMPOSITE MATERIAL

(71) Applicant: TOKAI CARBON KOREA CO., LTD., Anseong-si (KR)

(72) Inventor: Joung Il Kim, Seoul (KR)

(73) Assignee: TOKAI CARBON KOREA CO., LTD., Anseong-si (KR)

(*) Notice: Subject to any disclaimer, the term of this patent is extended or adjusted under 35 U.S.C. 154(b) by 982 days.

(21) Appl. No.: 16/325,983

(22) PCT Filed: Aug. 18, 2017

(86) PCT No.: PCT/KR2017/009002
§ 371 (c)(1),
(2) Date: Feb. 15, 2019

(87) PCT Pub. No.: WO2018/034532
PCT Pub. Date: Feb. 22, 2018

(65) Prior Publication Data
US 2019/0177172 A1   Jun. 13, 2019

(30) Foreign Application Priority Data
Aug. 18, 2016   (KR) .................. 10-2016-0104726

(51) Int. Cl.
*H01M 4/02* (2006.01)
*C01B 32/956* (2017.01)
(Continued)

(52) U.S. Cl.
CPC .......... *C01B 32/956* (2017.08); *C23C 16/325* (2013.01); *C30B 29/36* (2013.01);
(Continued)

(58) Field of Classification Search
CPC ...................................................... H01M 4/02
See application file for complete search history.

(56) References Cited

U.S. PATENT DOCUMENTS 4,472,476 A   9/1984   Veltri et al.
4,476,178 A   10/1984  Veltri et al.
(Continued)

FOREIGN PATENT DOCUMENTS

CN   1192538 A   9/1998
CN   102874809 A   1/2013
(Continued)

OTHER PUBLICATIONS

Summonte ("Silicon nanocrystals in carbide matrix" Solar Energy Materials and Solar Cells vol. 128, Sep. 2014, pp. 138-149.*
(Continued)

*Primary Examiner* — Jacob B Marks
(74) *Attorney, Agent, or Firm* — KDB Firm PLLC

(57) ABSTRACT

The present invention relates to an SiC material and an SiC composite material and, more particularly, to an SiC material and an SiC composite material having a diffraction intensity ratio (I) of an X-ray diffraction peak, calculated by formula 1 down below, of less than 1.5. The present invention can provide an SiC material and an SiC composite material which can be etched evenly when exposed to plasma and thereby reduce the occurrence of cracks, holes and so forth. [Formula 1] Diffraction intensity ratio (I)= (peak intensity of plane (200)+peak intensity of plane (220))/peak intensity of plane (111).

5 Claims, 3 Drawing Sheets

(51) Int. Cl.
*C30B 29/36* (2006.01)
*C23C 16/32* (2006.01)

(52) U.S. Cl.
CPC ...... *C01P 2002/70* (2013.01); *C01P 2002/74* (2013.01); *C01P 2004/84* (2013.01)

(56) References Cited

U.S. PATENT DOCUMENTS

| | | |
|---|---|---|
| 2007/0042153 A1 | 2/2007 | Forrest et al. |
| 2008/0124901 A1 | 5/2008 | Jyogo et al. |
| 2012/0061686 A1 | 3/2012 | Nishiguchi et al. |
| 2013/0269597 A1 | 10/2013 | Torimi |
| 2013/0285060 A1* | 10/2013 | Torimi ............... C30B 29/36 257/51 |
| 2016/0040299 A1 | 2/2016 | Allemand et al. |

FOREIGN PATENT DOCUMENTS

| | | |
|---|---|---|
| CN | 103270203 A | 8/2013 |
| EP | 2881494 A1 | 6/2015 |
| JP | H0692761 A | 4/1994 |
| JP | 11157989 A | 6/1999 |
| JP | 11199323 A | 7/1999 |
| JP | 2000169298 A | 6/2000 |
| JP | 2001130964 A | 5/2001 |
| JP | 2001107239 A | 1/2002 |
| JP | 2002234799 A | 8/2002 |
| JP | 2001130964 A | 11/2002 |
| JP | 2007513257 A | 12/2007 |
| JP | 2008277781 A | 11/2008 |
| JP | 2012136368 A | 1/2014 |
| KR | 1998070472 A | 11/2000 |
| KR | 20010070006 A | 7/2001 |
| KR | 20070026342 A | 3/2007 |
| KR | 101631797 B1 | 6/2016 |

OTHER PUBLICATIONS

Fusion Engineering and Design. Surface coating of graphite pebbles for Korean HCCR TBM. Youngmin Lee, Young-Hoon Yun, Yi-Hyun Park, Mu-Young Ahn, Seungyon Cho. pp. 1-5. Aug. 30, 2013.
International Search Report and Written Opinion Form PCT/ISA/210 and PCT/ISA/237, International Application No. PCT/KR2017/009002, pp. 1-8, International Filing Date Aug. 18, 2017, dated Nov. 29, 2017.

* cited by examiner

SIC MATERIAL AND SIC COMPOSITE MATERIAL

CROSS-REFERENCE TO RELATED APPLICATION

The present application is the United States National Stage entry of PCT/KR2017/009002, filed Aug. 18, 2017, which claims priority to Korean application No. 10-2016-0104726, filed Aug. 18, 2016, the entirety of each of which is hereby incorporated by reference.

1. Technical Field

The present invention relates to an SiC material and an SiC composite material using the same.

2. Background Art

Generally, when a carbon material which has been used in a semiconductor process of the related art is still used for a susceptor, a focus ring, or an electrode, there is a problem in that foreign matters are generated from the carbon material.

In consideration of the problems, a method of coating SiC or TaC on a surface of a carbon material structure has been used.

SiC is highly available because of a strong heat resistance, chemical resistance, and high physical strength. However, when SiC is used in the semiconductor field, a surface is etched under a plasma environment and the etching by the plasma has a different etching amount depending on a crystal orientation of SiC. Therefore, a product stability of an SiC material is lowered due to the different etching amount and frequent replacement of the SiC material causes the increase of a manufacturing cost of a semiconductor.

Technical Problem

The present invention has been made to solve the above-mentioned problems and provides an SiC material and an SiC composite material which are stably and evenly etched in a plasma environment.

Further, the present invention provides an SiC multilayer composite material.

Technical problems of the present invention are not limited to the above-mentioned technical problems, and other technical problems, which are not mentioned above, can be clearly understood by those skilled in the art from the following descriptions.

Technical Solution

An aspect of the present invention relates to an SiC material in which a diffraction intensity ratio I of an X-ray diffraction peak calculated by the following Formula 1 may be less than 1.5.

$$\text{Diffraction intensity ratio}(I) = (\text{peak intensity of plane}(200) + \text{peak intensity of plane}(220))/\text{peak intensity of plane}(111) \qquad \text{Formula 1}$$

According to an exemplary embodiment of the present invention, the diffraction intensity ratio I may be 1.21 or less.

According to an exemplary embodiment of the present invention, the diffraction intensity ratio I may be 1.0 or less.

According to an exemplary embodiment of the present invention, the diffraction intensity ratio I may be 0.9 or less.

According to an exemplary embodiment of the present invention, the diffraction intensity ratio I may be 0.8 or less.

According to an exemplary embodiment of the present invention, a value of 2θ of the peak of the plane (111), a value of 2θ of the peak of the plane (111) may be 35° to 36°, a value of 2θ of the peak of the plane (200) may be 41° to 42°, and a value of 2θ of the peak of the plane (220) may be 60° to 61°.

Another aspect of the present invention relates to an SiC composite material including a base, and an SiC coating layer formed on at least one surface of the base in which the diffraction intensity ratio I of the SiC coating layer is less than 1.5.

Another aspect of the present invention relates to an SiC multilayer composite material including a base, a first SiC coating layer formed on at least one surface of the base, and a second SiC coating layer formed on the first SiC coating layer in which the first SiC coating layer and the second SiC coating layer have different diffraction intensity ratios I of an X-ray diffraction peak calculated by the following Formula 1.

$$\text{Diffraction intensity ratio}(I) = (\text{peak intensity of plane}(200) + \text{peak intensity of plane}(220))/\text{peak intensity of plane}(111) \qquad \text{Formula 1}$$

According to an exemplary embodiment of the present invention, a diffraction intensity ratio I of the first SiC coating layer may be more than 1.21.

According to an exemplary embodiment of the present invention, a diffraction intensity ratio I of the first SiC coating layer may be more than 1.21 and less than 1.5.

According to an exemplary embodiment of the present invention, a diffraction intensity ratio I of the first SiC coating layer may be 1.5 or more.

According to an exemplary embodiment of the present invention, a diffraction intensity ratio I of the second SiC coating layer may be less than 1.5.

According to an exemplary embodiment of the present invention, a thickness ratio of the first SiC coating layer to the second SiC coating layer may be 1:0.1 to 1:0.95.

Effects

The present invention may provide an SiC material and an SiC composite material having a stable and uniform etching amount in a plasma environment by forming a plane (111) having a low etching amount by the plasma in a portion exposed to the plasma as a preferred growth crystal orientation.

The SiC material and the SiC composite material of the present invention may lower the occurrence frequency of cracks or holes in the plasma environment to increase the lifetime of the material.

The present invention shifts the preferred growth crystal orientation into a plane (111) by changing a process condition such as a supplying rate of a source gas and a growth rate so that economic efficiency and productivity for manufacturing an SiC material and an SiC composite material having a plane (111) as a preferred growth crystal orientation.

DETAILED DESCRIPTION AND BEST MODE FOR CARRYING OUT THE INVENTION

Hereinafter, exemplary embodiments of the present invention will be described in detail. In the description of the exemplary embodiment, a detailed description of known configurations or functions incorporated herein will be omitted when it is determined that the detailed description may make the subject matter of the present disclosure unclear. Further, terms used in the present description are used in order to appropriately represent preferred embodiments of the present invention and may be construed in different ways according to the intention of users or operators, or customary practice in the art to which the present invention pertains. Therefore, the definitions of terms used in the present description should be construed based on the contents throughout the specification.

The present invention relates to an SiC (silicon carbide) material and the SiC material grows a plane (111) as a preferred growth crystal orientation of a plasma exposed surface to provide a surface having an improved stability for the plasma environment and a uniform etching amount.

Figure 1A:
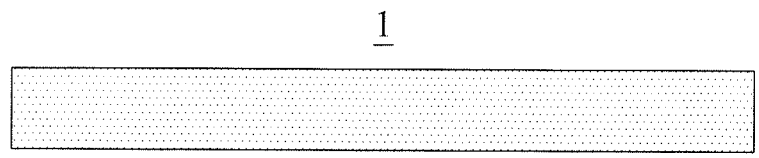
FIG. 1A exemplarily illustrates a cross-section of an SiC material of the present invention according to an exemplary embodiment of the present invention.
Figure 1B:
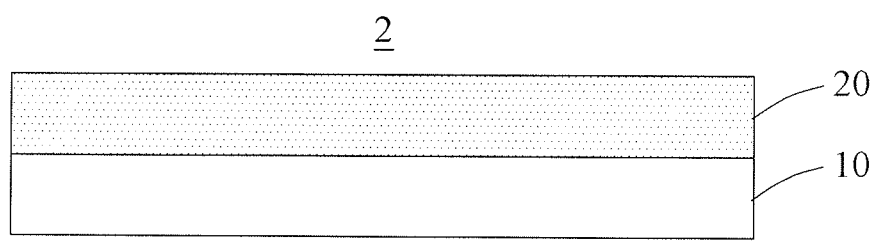
FIG. 1B exemplarily illustrates a cross-section of an SiC composite material of the present invention according to an exemplary embodiment of the present invention.
Figure 1C:
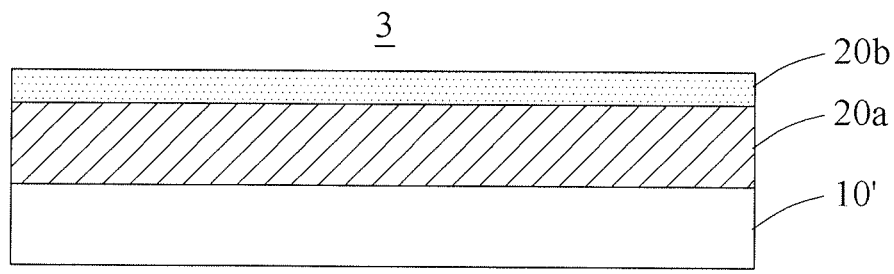
FIG. 1C exemplarily illustrates a cross-section of an SiC multilayer composite material of the present invention according to an exemplary embodiment of the present invention.
Figure 2A:
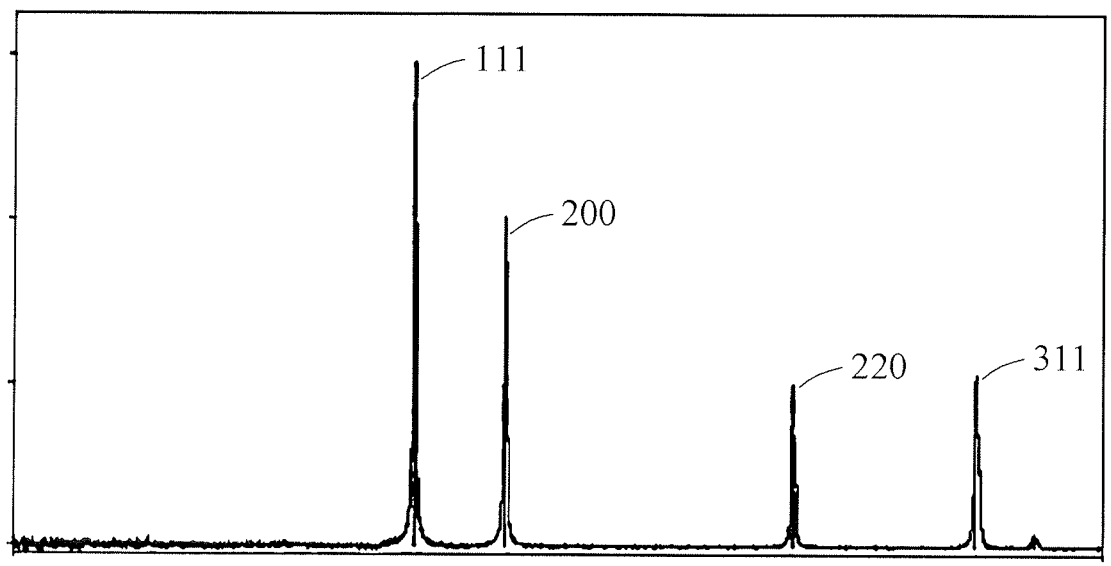
FIG. 2A exemplarily illustrates an X-ray diffraction pattern of an SiC material of the present invention according to an exemplary embodiment of the present invention.
Figure 2B:
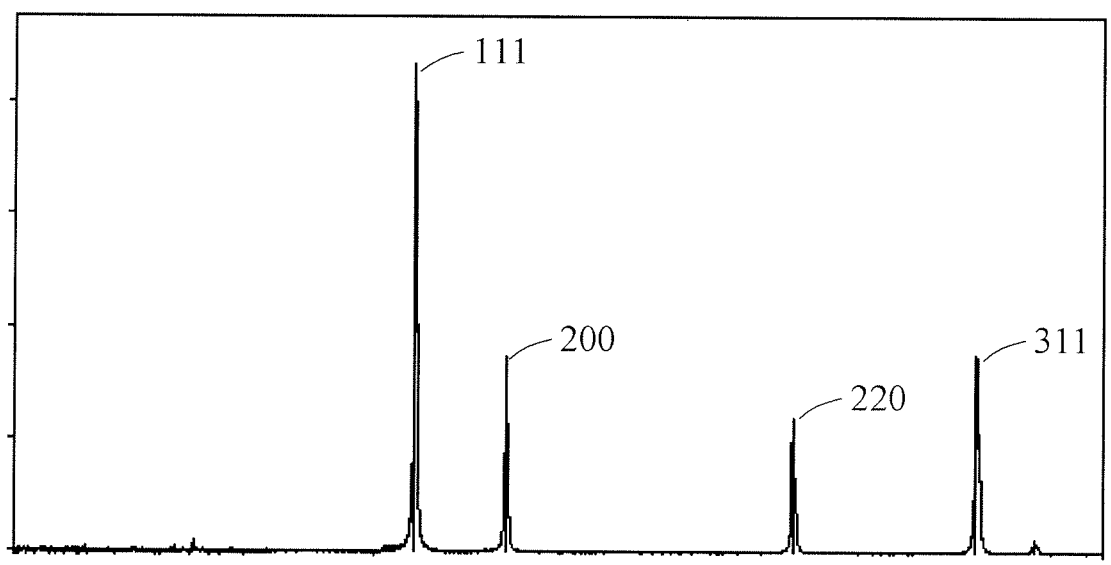
FIG. 2B exemplarily illustrates an X-ray diffraction pattern of an SiC material of the present invention according to an exemplary embodiment of the present invention.

According to an exemplary embodiment of the present invention, when referring to FIGS. 1A to 1C, 2A and 2B, FIGS. 1A to 1C exemplarily illustrate cross-sections of an SiC material, an SiC composite material, and an SiC multilayer composite material according to an exemplary embodiment of the present invention and FIGS. 2A and 2B exemplarily illustrate an X-ray diffraction pattern of an SiC material according to an exemplary embodiment of the present invention. As suggested in FIGS. 2A and 2B, an SiC material 1 of FIG. 1A has X-ray diffraction peaks of a plane (111), a plane (200), a plane (220), and a plane (311) as main peaks and among the peaks, the SiC 1 is grown with the plane (111) as a preferred growth crystal orientation and has a maximum diffraction intensity.

As an example of the present invention, the X-ray diffraction pattern of FIGS. 2A and 2B may be obtained using an X-ray diffraction measuring method applied in the technical field of the present invention. Even though not specifically mentioned in this specification, for example, a thin film or a powder X-ray diffraction measuring method may be used and desirably an X-ray is irradiated on a surface or a cutting plane of an SiC material and the composite material. As an X-ray analysis device, "Rigaku Dmax 2500" is used and an X-ray pattern with a diffraction intensity on a vertical axis and a diffraction angle 2θ on a horizontal axis is obtained and is applied to FIGS. 2A to 3.

As an example of the present invention, a diffraction intensity ratio I of the X-ray diffraction peak is calculated by the following Formula and a diffraction intensity ratio I of the X-ray diffraction peak may be less than 1.5 and desirably, may be 1.21 or less; 1.0 or less; 0.9 or less; or 0.8 or less. For example, referring to FIGS. 2A and 2B, FIG. 2A may be an SiC material having a diffraction intensity ratio I of 1.21 and FIG. 2B may be an SiC material having a diffraction intensity ratio I of 0.7. When the diffraction intensity ratio I is less than 1.5, the surface is evenly etched in a plasma environment and an etching amount of the plane (200) and the plane (220) of the related art is small and the occurrence of cracks and holes may be reduced as compared with the SiC material having a preferred growth crystal orientation.

$$\text{Diffraction intensity ratio}(I) = (\text{peak intensity of plane}(200) + \text{peak intensity of plane}(220))/\text{peak intensity of plane}(111) \quad \text{Formula 1}$$

As an example of the present invention, a value of 2θ of the peak of the plane (111) may be 35° to 36°, desirably, 35.2° to 35.8° or 35.6° to 35.8° and the peak of the plane (111) may have a maximum diffraction intensity.

As an example of the present invention, a value of 2θ of the peak of the plane (200) may be 41° to 42°. A value of 2θ of the peak of the plane (220) may be 60° to 61°.

As an example of the present invention, the SiC material 1 may be formed to have a thickness of 50 μm or larger, desirably 500 μm or larger, or 1 mm to 10 mm. When the thickness is included within the range of the above-mentioned thickness, a stability of the material is maintained in the plasma environment and the lifetime is increased to be used for a longer time.

The present invention relates to an SiC composite material and an SiC coating layer in which a crystal orientation which is least etched in the plasma environment is first grown is formed so that a stability of the composite material may be improved.

According to an exemplary embodiment of the present invention, referring to FIG. 1B, an SiC composite material 2 of the present invention may include a base 10 and an SiC coating layer 20 formed on one surface, both surfaces, or the entire surface of the base.

As an example of the present invention, the SiC composite material 2 may be exposed to the plasma through one surface, both surfaces, or the entire surface. The SiC coating layer 20 formed on a surface exposed to the plasma has X-ray diffraction peaks of a plane (111), a plane (200), a plane (220), and a plane (311) as major peaks and among the peaks, the plane (111) is grown as a preferred growth crystal orientation and has a maximum diffraction intensity. Further, the diffraction intensity ratio I of the X-ray diffraction peak calculated by Formula 1 may be less than 1.5 and desirably, 1.21 or less; 1.0 or less; 0.9 or less; or 0.8 or less.

As an example of the present invention, the base 10 is an SiC base material or a carbon base material. The carbon base material includes a material formed of carbon which is applied to a semiconductor process and for example, may be black lead, isotropic graphite, graphite, or a carbon fiber reinforced carbon composite material and desirably graphite.

As an example of the present invention, the SiC coating layer 20 may be formed to have a thickness of 5 μm or larger, desirably, 50 μm or larger; 1 mm or larger; or 1 mm to 10 mm. When the thickness is included in the range of the above-mentioned thickness, the stability of the product is maintained in the plasma environment and a damage of the base due to unevenly etched SiC coating layer may be prevented, and the lifetime of the material is increased.

The present invention relates to an SiC multilayer composite material and a plurality of SiC coating layers is formed on the base by changing a diffraction intensity ratio I so that the productivity of the product may be improved while lowering the etching amount in the plasma environment.

According to an exemplary embodiment of the present invention, referring to FIG. 1C, an SiC multilayer composite material 3 of the present invention may include a base 10', a first SiC coating layer 20a formed on one surface, both surfaces, or an entire surface of the base, and a second SiC coating layer 20b formed on the first SiC coating layer 20a.

As an example of the present invention, the base 10' is an SiC base material or a carbon base material as mentioned above.

As an example of the present invention, the first SiC coating layer 20a and the second SiC coating layer 20b may have different values of the diffraction intensity ratios I calculated by Formula 1.

Figure 3:
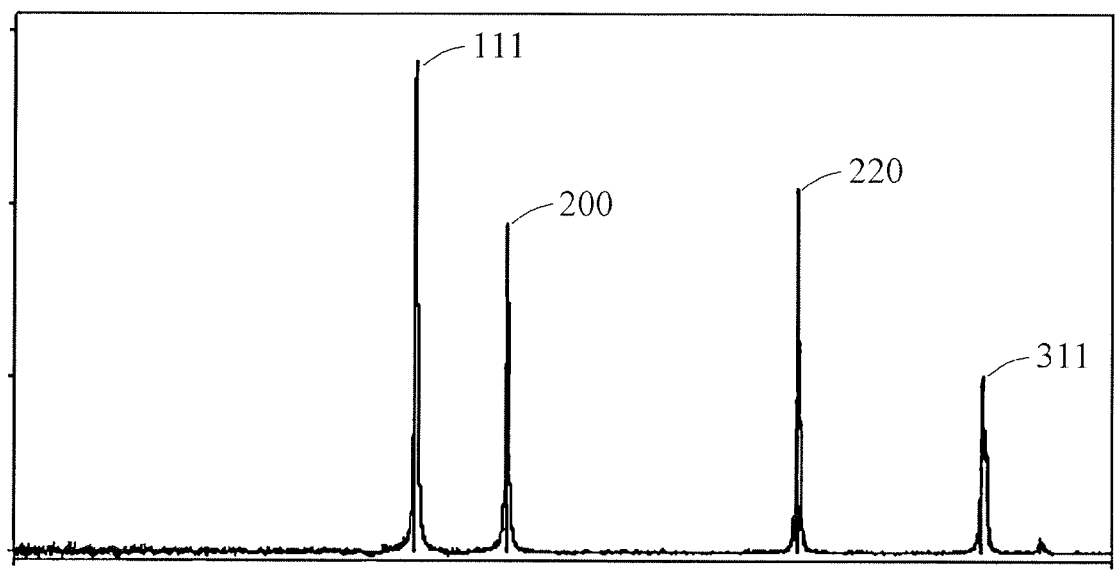
FIG. 3 exemplarily illustrates an X-ray diffraction pattern of an SiC multilayer composite material of the present invention according to an exemplary embodiment of the present invention.

For example, referring to FIG. 3, the first SiC coating layer 20a in FIG. 3 has X-ray diffraction peaks of the plane (111), the plane (200), the plane (220), and the plane (311) as major peaks and among the peaks, the plane (200) and the plane (220) may be grown as a preferred growth crystal orientation. Further, the diffraction intensity ratio I of the first SiC coating layer 20a calculated by the above Formula may be 1.5 or higher or 1.54 or higher and desirably, as illustrated in FIG. 3, the diffraction intensity ratio I may be 1.54. This is because the plane (200) and the plane (220) which are rapidly grown are grown first as the preferred growth crystal orientation and then the second SiC coating layer 21b which has a relatively low growth rate is formed so that the productivity of the SiC multilayer composite material may be ensured.

As another example, the first SiC coating layer 20a has the X-ray diffraction peaks of the plane (111), the plane (200), the plane (220), and the plane (311) as major peaks and among the peaks, the plane (111) is grown as the preferred growth crystal orientation and the plane (111) has the maximum diffraction intensity and also has a diffraction intensity ratio I which is different from that of the second SiC coating layer 20b. For example, the diffraction intensity ratio I is more than 1.21, and desirably, may more than 1.21 and less than 1.5 to improve the productivity of the composite material and the stability of the product in accordance with the plasma etching.

As an example of the present invention, the first SiC coating layer 20a may be formed to have a thickness of 5 μm or larger, desirably, 50 μm or larger; 1 mm or larger; or 1 mm to 10 mm or 5 mm to 7 mm. When the thickness is included in the range of the above-mentioned thickness, a damage of the base in the plasma environment may be prevented and the productivity of the composite material and an economical manufacturing cost may be ensured.

As an example of the present invention, the second SiC coating layer 20b has the X-ray diffraction peaks of the plane (111), the plane (200), the plane (220), and the plane (311) as major peaks and among the peaks, the plane (111) is grown as the preferred growth crystal orientation and has the maximum diffraction intensity. Further, the diffraction intensity ratio I of the X-ray diffraction peak calculated by Formula 1 may be less than 1.5 and desirably, 1.21; 1.0 or less; 0.9 or less; or 0.8 or less. Since the second SiC coating layer 20b is formed on a plasma exposed surface, a low etching amount and an evenly etched surface may be provided as compared with the plane (200) and the plane (220).

As an example of the present invention, the second SiC coating layer 20b may be formed to have a thickness of 5 μm or larger, desirably, 50 μm or larger; 1 mm or larger; 1 mm to 10 mm; or 1 mm to 5 mm. When the thickness is included in the range of the above-mentioned thickness, the stability of the product in the plasma environment is maintained and the lifetime of the composite material is increased because the plasma exposed surface is evenly etched.

As an example of the present invention, the thicknesses of the first SiC coating layer 20a and the second SiC coating layer 20b are different from each other and a thickness ratio of the first SiC coating layer 20a to the second SiC coating layer 20b is 1:0.1 to 1:0.95, desirably, 1:0.1 to 1:0.7, 1:0.1 to 1:0.5, or 1:0.1 to 1:0.4. When the ratio is included in the above-described thickness ratio, the first SiC coating layer 20a is formed to be thicker than the second SiC coating layer 20b at a relatively high growth rate so that the degradation of the productivity due to the formation of the second SiC coating layer which has a relatively low growth rate may be prevented and a composite material having a uniform etching amount in the plasma environment may be provided. The present invention provides a manufacturing method of an SiC material and an SiC composite material of the present invention.

According to an exemplary embodiment of the present invention, an SiC material 1 and an SiC composite material 2 may be manufactured by a method applied in the technical field of the present invention and for example, may be formed using a CVD and may be formed by applying an Si source gas, a C source gas, and a normal carrier gas such as hydrogen, nitrogen, helium, or argon. For example, the CVD may be performed under a process condition applied in the technical field of the present invention and for example, the SiC material 1 may be manufactured using a deposition device used in the technical field of the present invention.

The present invention provides a manufacturing method of an SiC multilayer composite material of the present invention.

According to an exemplary embodiment of the present invention, the SiC multilayer composite material 3 may be manufactured by a method applied in the technical field of the present invention and for example, formed using a CVD and may be formed by applying an Si source gas, a C source gas, and a normal carrier gas such as hydrogen, nitrogen, helium, or argon. For example, when the first SiC coating layer and the second SiC coating layer are formed, the growth rate is adjusted to change the preferred growth crystal orientation of the SiC coating layers to change the diffraction intensity ratio I. The main growth crystal orientation may be easily adjusted by adjusting the growth rate and the temperature of SiC rises at 50° C. or higher by the rate. After forming the first SiC coating layer which is in contact with the base at a high growth rate, the second SiC coating layer which is strong to the plasma etching is formed by lowering the growth rate so that the degradation of the productivity of the SiC multilayer composite material may be prevented.

The present invention may provide an SiC material, an SiC composite material, and an SiC multilayer composite material which are evenly etched with a low etching amount in the plasma environment and provide an SiC material, an SiC composite material, and an SiC multilayer composite material by adjusting a process condition at the time of manufacturing SiC, for example, a growth rate.

Although description has been made with reference to the exemplary embodiment of the present invention, the present invention is not limited thereto and modified and changed in various forms without departing from a spirit and the scope of the present invention described in the following claims, the detailed description of the present invention, and the accompanying drawings.

What is claimed is:

1. An SiC multilayer composite material, comprising:
   a base;
   a first SiC coating layer formed on at least one surface of the base; and
   a second SiC coating layer formed on the first SiC coating layer,
   wherein the first SiC coating layer and the second SiC coating layer have different diffraction intensity ratios I of an X-ray diffraction peak calculated by Diffraction intensity ratio (I)=(peak intensity of plane (200)+peak intensity of plane (220))/peak intensity of plane (111), and wherein a diffraction intensity ratio I of the first SiC coating layer is more than 1.21.

2. The SiC multilayer composite material of claim 1, wherein a diffraction intensity ratio I of the first SiC coating layer is more than 1.21 and less than 1.5.

3. The SiC multilayer composite material of claim 1, wherein a diffraction intensity ratio I of the first SiC coating layer is 1.5 or more.

4. The SiC multilayer composite material of claim 1, wherein a diffraction intensity ratio I of the second SiC coating layer is less than 1.5.

5. The SiC multilayer composite material of claim 1, wherein a thickness ratio of the first SiC coating layer to the second SiC coating layer is I:0.1 to I: 0.95.

* * * * *